United States Patent
Choi

(10) Patent No.: US 9,871,159 B2
(45) Date of Patent: Jan. 16, 2018

(54) APPARATUS FOR GENERATING ELECTRICITY USING SOLAR POWER AND METHOD FOR MANUFACTURING SAME

(75) Inventor: Chul Hwan Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 783 days.

(21) Appl. No.: 13/639,039

(22) PCT Filed: Apr. 27, 2011

(86) PCT No.: PCT/KR2011/003100
§ 371 (c)(1),
(2), (4) Date: Dec. 17, 2012

(87) PCT Pub. No.: WO2012/015149
PCT Pub. Date: Feb. 2, 2012

(65) Prior Publication Data
US 2013/0092220 A1    Apr. 18, 2013

(30) Foreign Application Priority Data
Jul. 30, 2010    (KR) .................. 10-2010-0074412

(51) Int. Cl.
*H01L 31/00* (2006.01)
*H01L 31/065* (2012.01)
(Continued)

(52) U.S. Cl.
CPC .... *H01L 31/065* (2013.01); *H01L 31/022466* (2013.01); *H01L 31/0392* (2013.01);
(Continued)

(58) Field of Classification Search
CPC ..... H01L 31/076; H01L 31/065; H01L 31/18; H01L 31/0392; H01L 31/0749;
(Continued)

(56) References Cited

U.S. PATENT DOCUMENTS

| 5,078,804 A | * | 1/1992 | Chen ................. H01L 31/02168 |
| | | | 136/260 |
| 2002/0119592 A1 | * | 8/2002 | Oswald ................... H02S 20/00 |
| | | | 438/96 |

(Continued)

FOREIGN PATENT DOCUMENTS

| JP | H05-13790 A | 1/1993 |
| JP | H11-284211 A | 10/1999 |

(Continued)

OTHER PUBLICATIONS

International Search Report in International Application No. PCT/KR2011/003100, filed Apr. 27, 2011.
(Continued)

*Primary Examiner* — Uyen Tran
(74) *Attorney, Agent, or Firm* — Saliwanchik, Lloyd & Eisenschenk

(57) ABSTRACT

Disclosed are a solar cell apparatus and a method of fabricating the same. The solar cell apparatus includes a substrate, a back electrode layer on the substrate, a light absorbing layer on the back electrode layer, a first window layer including a first oxide on the light absorbing layer, and a second window layer provided on the first window layer and including a second oxide having a composition ratio of oxygen higher than a composition ratio of oxygen contained in the first oxide.

6 Claims, 3 Drawing Sheets

(51) Int. Cl.
*H01L 31/0392* (2006.01)
*H01L 31/0749* (2012.01)
*H01L 31/18* (2006.01)
*H01L 31/0224* (2006.01)
*H01L 31/046* (2014.01)
*H01L 31/0465* (2014.01)

(52) U.S. Cl.
CPC .. *H01L 31/03923* (2013.01); *H01L 31/03925* (2013.01); *H01L 31/046* (2014.12); *H01L 31/0465* (2014.12); *H01L 31/0749* (2013.01); *H01L 31/18* (2013.01); *Y02E 10/541* (2013.01)

(58) Field of Classification Search
CPC ........... H01L 31/022466; H01L 31/046; H01L 31/0465; H01L 31/03923; H01L 31/03925
USPC .................................................. 136/255, 256
See application file for complete search history.

(56) References Cited

U.S. PATENT DOCUMENTS

| | | | |
|---|---|---|---|
| 2004/0187914 A1* | 9/2004 | Matsuda | H01L 31/0687 136/255 |
| 2005/0284518 A1 | 12/2005 | Yamada et al. | |
| 2008/0047602 A1 | 2/2008 | Krasnov | |
| 2008/0096376 A1* | 4/2008 | Li | H01L 31/022466 438/597 |
| 2008/0153280 A1 | 6/2008 | Li et al. | |
| 2009/0014065 A1 | 1/2009 | Mueller et al. | |
| 2009/0194161 A1 | 8/2009 | Ji et al. | |
| 2010/0236607 A1* | 9/2010 | Korevaar | H01L 31/02 136/249 |
| 2011/0011451 A1 | 1/2011 | Hakuma et al. | |
| 2012/0138134 A1* | 6/2012 | Higashikawa | H01L 31/02167 136/255 |

FOREIGN PATENT DOCUMENTS

| | | | | |
|---|---|---|---|---|
| JP | 2001-284620 A | | 10/2001 | |
| JP | 2010-098263 A | | 4/2010 | |
| JP | 2010-514920 A | | 5/2010 | |
| JP | WO2011024867 | * | 3/2011 | ............ H01L 31/00 |
| JP | 2011-511470 A | | 4/2011 | |
| JP | 2011-171384 A | | 9/2011 | |
| KR | 10-2008-0031785 A | | 4/2008 | |
| KR | 10-2010-0013180 A | | 2/2010 | |
| KR | 10-2010-0066975 A | | 6/2010 | |
| KR | 10-2010-0096642 A | | 9/2010 | |
| KR | 10-2011-0043358 A | | 4/2011 | |
| WO | WO-2009/110093 A1 | | 9/2009 | |
| WO | WO-2010/032542 A1 | | 3/2010 | |

OTHER PUBLICATIONS

Notice of Allowance dated Oct. 27, 2011 in Korean Application No. 10-2010-0074412, filed Jul. 30, 2010.
Office Action dated Sep. 24, 2014 in Japanese Application No. 2013-521674.
Extended European Search Report dated Dec. 4, 2017 in European Application No. 11812680.4.

* cited by examiner

APPARATUS FOR GENERATING ELECTRICITY USING SOLAR POWER AND METHOD FOR MANUFACTURING SAME

CROSS-REFERENCE TO RELATED APPLICATIONS

This application is the U.S. national stage application of International Patent Application No. PCT/KR2011/003100, filed Apr. 27, 2011, which claims priority to Korean Application No. 10-2010-0074412, filed Jul. 30, 2010, the disclosures of each of which are incorporated herein by reference in their entirety.

TECHNICAL FIELD

The embodiment relates to a solar cell apparatus and a method of fabricating the same.

BACKGROUND ART

Recently, as energy consumption is increased, a solar cell has been developed to convert solar energy into electrical energy.

In particular, a CIGS-based solar cell apparatus, which is a PN hetero junction apparatus having a substrate structure including a glass substrate, a metallic back electrode layer, a P type CIGS-based light absorbing layer, a high resistance buffer layer, and an N type window layer, has been extensively used.

In addition, studies have been performed to improve electrical and optical characteristics, such as low resistance and high transmittance, in a solar cell apparatus.

DISCLOSURE

Technical Problem

The embodiment provides a solar cell apparatus capable of representing improved efficiency and high productivity, and a method of fabricating the same.

Technical Solution

According to the embodiment, there is provided a solar cell apparatus including a substrate, a back electrode layer on the substrate, a light absorbing layer on the back electrode layer, a first window layer including a first oxide on the light absorbing layer, and a second window layer provided on the first window layer and including a second oxide having a composition ratio of oxygen higher than a composition ratio of oxygen contained in the first oxide.

According to the embodiment, there is provided a solar cell apparatus including a substrate, a back electrode layer on the substrate, a light absorbing layer on the back electrode layer, a window layer on the light absorbing layer, and a connection part extending from the window layer and connected to the back electrode layer through the light absorbing layer. The connection part includes a first conductive layer directly making contact with the back electrode layer and including a first oxide, and a second conductive layer provided on the first conductive layer and including a second oxide having a composition ratio of oxygen higher than a composition ratio of oxygen contained in the first oxide.

According to the embodiment, there is provided a method of fabricating a solar cell apparatus. The method includes forming a back electrode layer on a substrate, forming a light absorbing layer on the back electrode layer, forming a first window layer including a first oxide on the light absorbing layer, and forming a second window layer provided on the first window layer and including a second oxide having a composition ratio of oxygen higher than a composition ratio of oxygen contained in the first oxide.

Advantageous Effects

The solar cell apparatus includes a window layer including a second window layer having the high content of oxygen. Therefore, the transmittance of the window layer can be improved, and the surface resistance of the window layer can be reduced. Accordingly, the solar cell apparatus of the embodiment can represent improved efficiency.

In addition, the second window layer constituting the window layer is formed through the sputtering process at an oxygen atmosphere. Therefore, when performing the sputtering process, arcing can be blocked. Accordingly, the window layer can be easily formed. The solar cell apparatus according to the embodiment can represent improved productivity.

In addition, the connection part is connected to the back electrode layer through the first conductive layer having the low content of oxygen. Accordingly, the connection characteristic between the connection part and the back electrode layer can be improved. The solar cell apparatus according to the embodiment can represent improved characteristics.

BEST MODE

Mode for Invention

Figure 1:
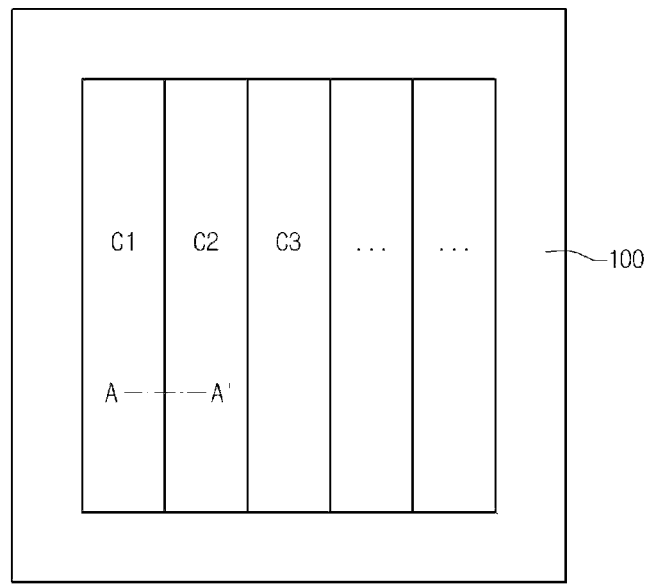
FIG. 1 is a plan view showing a solar cell apparatus according to the embodiment.

In the description of the embodiments, it will be understood that, when a substrate, a film, a layer, or an electrode is referred to as being "on" or "under" another substrate, film, layer, or electrode, it can be "directly" or "indirectly" on the other substrate, film, layer, or electrode, or one or more intervening layers may also be present. Such a position of the element described with reference to the drawings. The thickness and size of each element shown in the drawings may be exaggerated, omitted or schematically drawn for the purpose of convenience or clarity. In addition, the size of elements does not utterly reflect an actual size.

Figure 2:
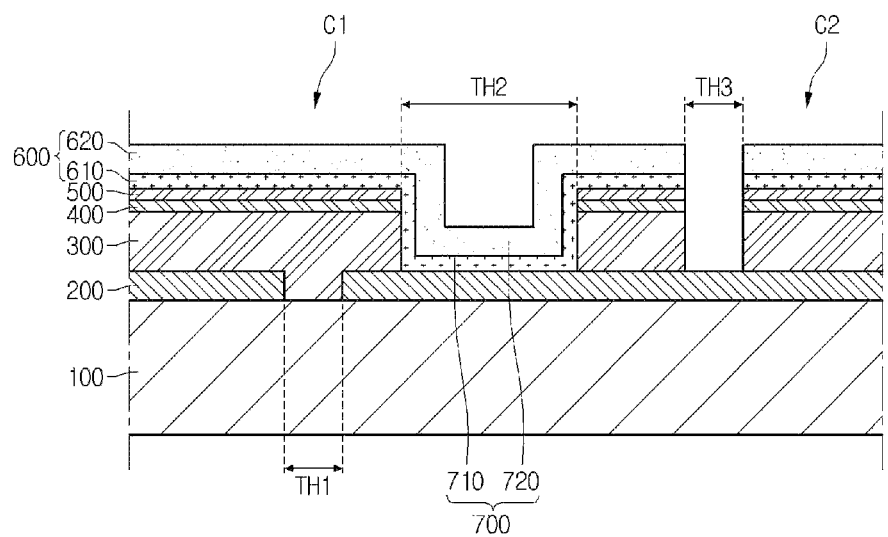
FIG. 2 is a sectional view taken along line A-A' of FIG. 1.

FIG. 1 is a plan view showing a solar cell apparatus according to the embodiment, and FIG. 2 is a sectional view taken along line A-A' of FIG. 1.

Referring to FIGS. 1 and 2, the solar cell apparatus includes a support substrate 100, a back electrode layer 200, a light absorbing layer 300, a buffer layer 400, a high resistance buffer layer 500, a window layer 600, and a plurality of connection parts 700.

The support substrate 100 has a plate shape and supports the back electrode layer 200, the light absorbing layer 300, the buffer layer 400, the high resistance buffer layer 500, the window layer 600, and the connection parts 700.

The support substrate 100 may include an insulator. The support substrate 100 may include a glass substrate, a plastic substrate, or a metallic substrate. In more detail, the support substrate 100 may include a soda lime glass substrate. The support substrate 100 may be transparent or may be rigid or flexible.

The back electrode layer 200 is provided on the substrate 100. The back electrode layer 200 may be a conductive layer. The back electrode layer 200 may include a metal, such as molybdenum (Mo).

In addition, the back electrode layer 200 may include at least two layers. In this case, the layers may be formed by using the homogeneous metal or heterogeneous metals.

The back electrode 200 is provided therein with first through holes TH1. The first through holes TH1 are open regions to expose the top surface of the support substrate 100. When viewed in a plan view, the first through holes TH1 may have a shape extending in one direction.

The first through holes TH1 may have a width in the range of about 80 μm to about 200 μm.

The back electrode layer 200 is divided into a plurality of back electrodes by the first through holes TH1. In other words, the back electrodes are defined by the first through holes TH1.

The back electrodes are spaced apart from each other by the first through holes TH1. The back electrodes are arranged in the form of a stripe.

In addition, the back electrodes may be arranged in the form of a matrix. In this case, when viewed in a plan view, the first through holes TH1 may be provided in the form of a lattice.

The light absorbing layer 300 is provided on the back electrode layer 200. In addition, a material constituting the light absorbing layer 300 is filled in the first through holes TH1.

The light absorbing layer 300 includes a group I-III-VI compound. For example, the light absorbing layer 300 may have a $Cu(In,Ga)Se_2$ (CIGS) crystal structure, a $Cu(In)Se_2$ crystal structure, or a $Cu(Ga)Se_2$ crystal structure.

The light absorbing layer 300 has an energy bandgap in the range of about 1 eV to about 1.8 eV.

A plurality of light absorbing parts are defined in the light absorbing layer 300 by second through holes TH2. In other words, the light absorbing layer 300 is divided into the light absorbing parts by the second through holes TH2.

The buffer layer 400 is provided on the light absorbing layer 300. The buffer layer 400 includes CdS and has an energy bandgap in the range of about 2.2 eV to about 2.4 eV.

The high resistance buffer layer 500 is provided on the buffer layer 400. The high-resistance buffer layer 500 may include iZnO, which is zinc oxide not doped with impurities. The high resistance buffer layer 500 has an energy bandgap in the range of about 3.1 eV to about 3.3 eV.

The light absorbing layer 300, the buffer layer 400, and the high resistance buffer layer 500 are formed therein with the second through holes TH2. The second through holes TH2 are formed through the light absorbing layer 300. In addition, the second through holes TH2 are open regions to expose the top surface of the back electrode layer 200.

The second through holes TH2 are adjacent to the first through holes TH1. In other words, when viewed in a plan view, portions of the second through holes TH2 are formed beside the first through holes TH1.

Each second through holes TH2 may have a width in the range of about 80 μm to about 200 μm.

The window layer 600 is provided on the high resistance buffer layer 500. The window layer 600 is transparent, and includes a conductive layer.

In more detail, the window layer 600 may include a metallic. For example, the window layer 600 may include an Al doped zinc oxide (AZO), or a Ga doped zinc oxide (GZO).

In addition, the oxide may include conductive impurities such as aluminum (Al), alumina ($Al_2O_3$), magnesium (Mg), or gallium (Ga). In more detail, the window layer 600 may include Al doped zinc oxide (AZO) or Ga doped zinc oxide (GZO).

The window layer 600 includes first and second window layers 610 and 620. The first window layer 610 is provided on the high resistance buffer layer 500, and the second window layer 620 is provided on the first window layer 610.

The first window layer 610 has an oxygen composition ratio lower than that of the second window layer 620. In other words, the first window layer 610 may have oxygen content lower than that of the second window layer 620.

In more detail, the first window layer 610 includes a first oxide, and the second window layer 620 includes a second oxide. In this case, the oxygen composition ratio of the second oxide may be greater than that of the first oxide.

In other words, the first and second window layers 610 and 620 may include AZO. In this case, the first window layer 610 includes zinc oxide having a lower oxygen composition ratio, and the second window layer 620 includes zinc oxide having a higher oxygen composition ratio.

For example, the first oxide may be expressed in first chemical formula, and the second oxide may be expressed in second chemical formula.

$(Zn,Al)O_X$, in which $0.90<X<0.95$.  Chemical Formula 1

$(Zn,Al)O_Y$, in which $0.96<Y<1$  Chemical formula 2

The thickness of the first window layer 610 may be about 5% to about 10% of the thickness of the window layer 600. In addition, the thickness of the second window layer 629 may be about 90% to about 95% of the thickness of the window layer 600. For example, the thickness of the window layer 600 may be in the range of about 800 nm to about 1200 nm, and the thickness of the first window layer 610 may be in the range of about 40 nm to about 120 nm.

The buffer layer 400, the high resistance buffer layer 500, and the window layer 600 are formed therein with third through holes TH3. The third through holes TH3 are open regions to expose the top surface of the back electrode layer 200. For example, the width of the third through holes TH3 may be in the range of about 80 μm to about 200 μm.

The third through holes TH3 are adjacent to the second through holes TH2. In more detail, the third through holes TH3 are formed beside the second through holes TH2. In other words, when viewed in a plan view, the third through holes TH3 are formed beside the second through holes TH2.

The buffer layer 400 is divided into a plurality of buffers by the third through holes TH3.

Similarly, the high resistance buffer layer 500 is divided into a plurality of high resistance buffers by the third through holes TH3.

The window layer 600 is divided into a plurality of windows by the third through holes TH3. In other words, the windows are defined by the third through holes TH3.

The windows form a shape corresponding to that of the back electrodes. In other words, the windows are arranged in the form of a stripe. In addition, the windows may be arranged in the form of a matrix.

A plurality of cells C1, C2, . . . , and CN are defined by the third through holes TH3. In detail, the cells C1, C2, . . . , and CN are defined by the second through hole TH2 and the third through hole TH3. In other words, the solar cell apparatus according to the embodiment is divided into the cells C1, C2, . . . , and CN by the second and third through holes TH2 and TH3.

The connection parts 700 are provided at the inside of the second through holes TH2. Each connection part 700 extends downward from the window layer 600 and is connected to the back electrode layer 200. For example, each connection part 700 extends from a window of the first cell C1 and is connected to a back electrode of the second cell C2.

In addition, the connection parts 700 connect adjacent cells to each other. In more detail, the connection parts 700 connect windows and back electrodes, which constitute adjacent cells, to each other.

Each connection part 700 is integrally formed with the window layer 600. In other words, a material constituting the connection part 700 is identical to a material constituting the window layer 600. Each connection part 700 includes first and second conductive layers 710 and 720.

The first conductive layer 710 is connected to the first window layer 610. In more detail, the first conductive layer 710 is integrally formed with the first window layer 610. The first conductive layer 710 includes the first oxide. In other words, the first conductive layer 710 has lower oxygen content.

The first conductive layer 710 is directly connected to the back electrode 200. In other words, the first conductive layer 710 is connected to the back electrode 200 by directly making contact with the back electrode 200.

The second conductive layer 720 is provided on the first conductive layer 710. The second conductive layer 720 is provided inside the second through holes TH2.

The second conductive layer 720 is connected to the second window layer 620. In more detail, the second conductive layer 720 is integrally formed with the second window layer 620. The second conductive layer 720 includes a second oxide. In other words, the second conductive layer 720 has higher oxygen content.

The connection part 700 is connected to the back electrode 200 through the first conductive layer 710 having lower oxygen content. Therefore, the connection characteristic between the first conductive layer 710 and the back electrode 200 can be improved, and the cells C1, C2, . . . , and CN are connected to each other through the connection parts 700.

Therefore, according to the solar cell apparatus of the embodiment, the cells C1, C2, . . . , and CN are shorted with each other, so that improved power generation efficiency can be represented.

Since the second window layer 620 has higher oxygen content, the second window layer 620 has low carrier concentration. For example, the first window layer 610 may have carrier concentration of about $3 \times 10^{20}/cm^2$ to about $9 \times 10^{20}/cm^2$, and the second window layer 620 may have carrier concentration of about $1 \times 10^{20}/cm^2$ to about $2 \times 10^{20}/cm^2$. Since the second window layer 620 has low carrier concentration, the light having a long wavelength band may easily pass through the second window layer 620.

In addition, since the second window layer 620 is formed at an oxygen atmosphere, the number of defects is less. In other words, in the process of forming the second window layer 620, oxygen contained in oxygen gas reduces the defects of the second window layer 620. Therefore, the second window layer 620 may easily pass through the light having a short wavelength band.

In addition, the crystal of the second window layer 620 is uniformly formed by the oxygen. Therefore, the second window layer 620 has low sheet resistance.

Therefore, the window layer 600 constituting the solar cell apparatus of the embodiment represents improved transmittance and improved conductivity. Therefore, the solar cell apparatus of the embodiment represents improved performance.

In addition, the second window layer 620 is formed through the sputtering process at an oxygen atmosphere. Therefore, when performing the sputtering process, arcing is blocked, so that the solar cell apparatus according to the embodiment can be effectively produced.

FIGS. 3 to 7 are sectional views the method of fabricating the solar cell apparatus according to the embodiment. Hereinafter, the present method will be described by making reference to the description of the solar cell apparatus.

Figure 3:
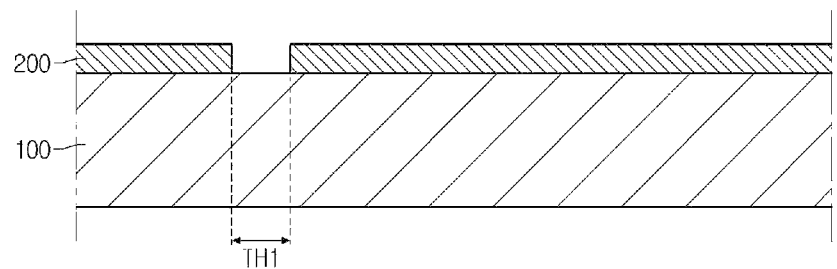
FIGS. 3 to 7 are sectional views showing a method of fabricating the solar cell apparatus according to the embodiment.

Referring to FIG. 3, the back electrode layer 200 is formed on the support substrate 100. The first through holes TH1 are formed by patterning the back electrode layer 200. Therefore, the back electrodes are formed on the support substrate 100. The back electrode layer 200 is patterned by using a laser.

The first through holes TH1 expose the top surface of the support substrate 100, and may have a width in the range of about 80 μm to about 200 μm.

In addition, an additional layer may be interposed between the support substrate 100 and the back electrode layer 200. In this case, the first through holes TH1 expose the top surface of the additional layer.

Figure 4:
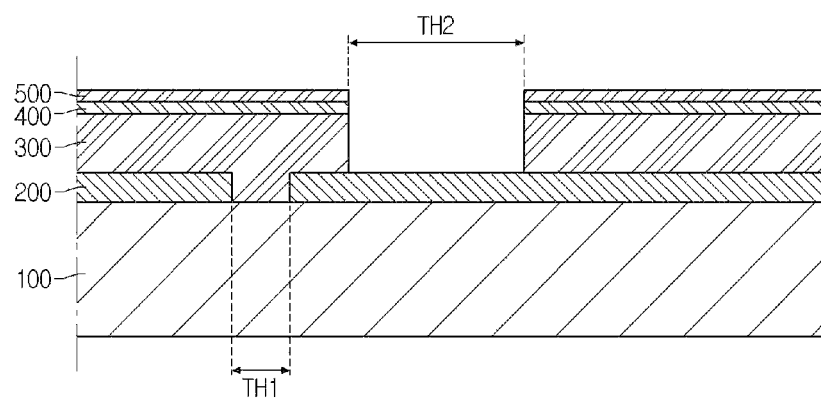

Referring to FIG. 4, the light absorbing layer 300, the buffer layer 400, and the high resistance buffer layer 500 are formed on the back electrode 200.

The light absorbing layer 300 may be formed through the sputtering process or the evaporation scheme.

For example, the light absorbing layer 300 may be formed through various schemes such as a scheme of forming a Cu(In,Ga)Se2 (CIGS) based light absorbing layer 300 by simultaneously or separately evaporating Cu, In, Ga, and Se and a scheme of performing a selenization process after a metallic precursor layer has been formed.

Regarding the details of the selenization process after the formation of the metallic precursor layer, the metallic precursor layer is formed on the back electrode layer 200 through a sputtering process employing a Cu target, an In target, a Ga target or an alloy target.

Thereafter, the metallic precursor layer is subject to the selenization process so that the Cu (In, Ga) Se$_2$ (CIGS) based light absorbing layer 300 is formed.

In addition, the sputtering process employing the Cu target, the In target, and the Ga target and the selenization process may be simultaneously performed.

Further, a CIS or a CIG based light absorbing layer 300 may be formed through the sputtering process employing only Cu and In targets or only Cu and Ga targets and the selenization process.

Thereafter, the buffer layer 400 is formed by depositing CdS through a sputtering process or a chemical bath deposition (CBD) scheme.

Thereafter, the high resistance buffer layer 500 is formed by depositing zinc oxide on the buffer layer 400 through a sputtering process.

The buffer layer 400 and the high resistance buffer layer 500 are formed at a low thickness. For example, the buffer layer 400 and the high resistance buffer layer 500 have a thickness in the range of about 1 nm to about 89 nm.

Thereafter, the second through holes TH2 are formed by removing portions of the light absorbing layer 300, the buffer layer 400, and the high resistance buffer layer 500.

The second through holes TH2 may be formed by using a mechanical device such as a tip or a laser device.

For example, the light absorbing layer 300 and the buffer layer 400 may be patterned by a tip having a width in a range of about 40 μm to about 180 μm. The second through holes TH2 may be formed by a laser device having a wavelength in the range of about 200 nm to about 600 nm.

In this case, the second through holes TH2 may have a width in the range of about 100 μm to about 200 μm. In addition, the second through holes TH2 expose the top surface of the back electrode layer 200.

Figure 5:
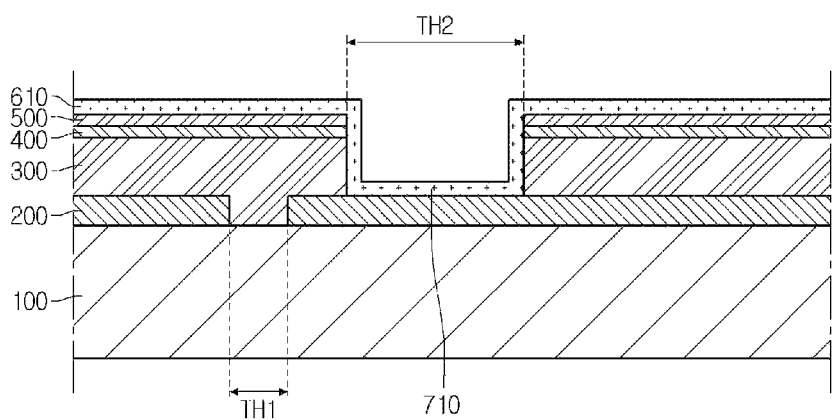

Referring to FIG. 5, the first window layer 610 is formed on the light absorbing layer 300 and in the second through holes TH2. In other words, the first window layer 610 is formed by depositing a transparent conductive material on the high resistance buffer layer 500 and in the second through holes TH2.

In this case, the transparent conductive material is filled in the second through holes TH2, and the first window layer 610 directly makes contact with the back electrode layer 200.

In this case, the first window layer 610 may be formed by depositing the transparent conductive material at a non-oxygen atmosphere. In detail, the first window layer 610 may be formed by depositing AZO at the atmosphere of the inert gas that does not include oxygen.

In more detail, the first window layer 610 may be formed through the sputtering process at an Ar atmosphere or the atmosphere of Ar+$H_2$. In more detail, the sputtering process to form the first window layer 610 may be performed with power of 2.6 W/cm$^2$ to 4.5 W/cm$^2$ at the process pressure of 3 mtorr to 10 mtorr while applying Ar gas of 100 sccm to 200 sccm.

Figure 6:
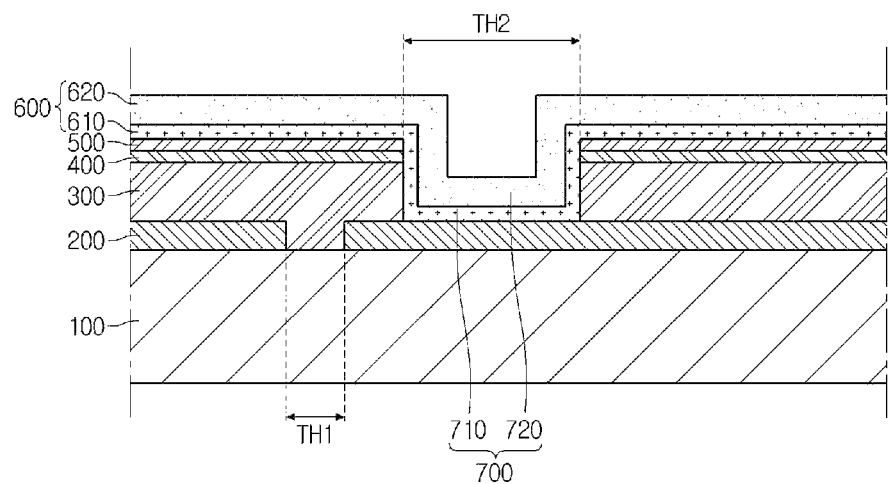

Referring to FIG. 6, the second window layer 620 is formed on the first window layer 610. The second window layer 620 is formed at the oxygen atmosphere. In other words, the second window layer 620 is formed by depositing the transparent conductive material on the first window layer 610 at the oxygen atmosphere.

In more detail, the second window layer 620 may be formed by depositing material such as AZO on the first window layer 610 at gas atmosphere including oxygen and inert gas.

In more detail, the second window layer 620 may be formed through the sputtering process at the atmosphere of Ar+$O_2$. In more detail, the sputtering process to form the second window layer 620 may be performed with power of 2.6 W/cm$^2$ to 4.5 W/cm$^2$ at the process pressure of 5 mtorr to 8 mtorr while applying oxygen mixed gas of about 0.05 vol % to about 1.5 vol % and Ar gas of 100 sccm to 200 sccm.

As described above, since the second window layer 620 is formed at the oxygen atmosphere, the second window layer 620 has the content of the oxygen higher than that of the first window layer 620. In other words, the oxygen composition ratio of the second oxide is greater than that of the first oxide.

Figure 7:
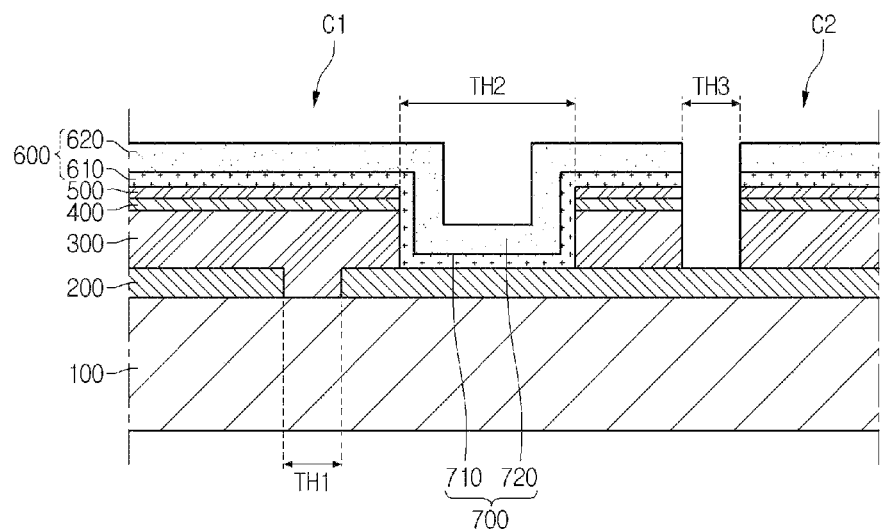

Referring to FIG. 7, the third through holes TH3 are formed by removing potions of the buffer layer 400, the high resistance buffer layer 500, and the window layer 600. Therefore, a plurality of windows and a plurality of cells C1, C2, . . . , and CN are defined by patterning the window layer 600. The third through holes TH3 have a width in the range of about 80 nm to about 200 nm.

As described above, according to the method of fabricating the solar cell apparatus of the embodiment, the connection part 700 representing an improved connection characteristic is provided, and the solar cell apparatus including the window layer 600 having the improved characteristics can be provided.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
   a substrate;
   a back electrode layer on the substrate;
   a light absorbing layer on the back electrode layer;
   a buffer layer on the light absorbing layer;
   a window layer on the buffer layer; and
   a connection part extending from the window layer and connected to the back electrode layer;
   wherein the window layer includes a first window layer and a second window layer;
   wherein an oxygen level of the window layer is gradually increased away from an interfacial surface between the light absorbing layer and the window layer;
   wherein the first window layer includes a first oxide on the light absorbing layer;
   wherein the second window layer is disposed on the first window layer;
   wherein the second window layer includes a second oxide having a composition ratio of oxygen higher than a composition ratio of oxygen contained in the first oxide;
   wherein the first window layer makes direct physical contact with the buffer layer;
   wherein the second window layer makes direct physical contact with the first window layer;
   wherein the connection part comprises:
     a first conductive layer integrally formed with the first window layer and directly making contact with the back electrode layer; and
     a second conductive layer integrally formed with the second window layer and provided on the first conductive layer;
   wherein the first conductive layer has a thickness smaller than a thickness of the second conductive layer, wherein the conductive layer has an oxygen composition ratio lower than an oxygen composition ratio of the second conductive layer;

wherein the second window layer comprises a first upper surface and a second upper surface lower than the first upper surface, and wherein the second upper surface of the second window layer is lower than an upper surface of the light absorbing layer.

2. The solar cell apparatus of claim 1, wherein the first window layer includes a material of chemical formula 1, and the second window layer includes a material of chemical formula 2, $(Zn,Al)O_X$, in which $0.90<X<0.95$, and  Chemical Formula 1

$(Zn,Al)O_Y$, in which $0.96<Y<1$,  Chemical Formula 2 wherein the first window layer has a thickness in a range of from 40 nm to 120 nm.

3. The solar cell apparatus of claim 2, wherein the first and second oxides include a material selected from the group consisting of a zinc oxide, an indium tin oxide, and an indium zinc oxide, and the first and second oxides are doped with conductive impurities.

4. The solar cell apparatus of claim 3,
wherein the light absorbing layer has first through holes to expose the back electrode layer; and
the connection part is provided in the first through holes.

5. The solar cell apparatus of claim 1, wherein a thickness of the first window layer is 5% to 10% of a thickness of the window layer,
wherein a thickness of the second window layer is 90% to 95% of the thickness of the window layer, and
wherein the thickness of the window layer is in a range of from 800 nm to 1200 nm.

6. The solar cell apparatus of claim 1, wherein the second window layer has a carrier concentration lower than a carrier concentration of the first window layer,
wherein the first window layer has the carrier concentration of $3\times10^{20}/cm^2$ to $9\times10^{20}/cm^2$, and
wherein the second window layer has the carrier concentration of $1\times10^{20}/cm^2$ to $2\times10^{20}/cm^2$.

* * * * *